United States Patent [19]

Tsumura

[11] Patent Number: 4,886,200
[45] Date of Patent: Dec. 12, 1989

[54] CAPILLARY TIP FOR BONDING A WIRE

[75] Inventor: Kiyoaki Tsumura, Itami City, Japan

[73] Assignee: Mitsubishi Denki Kabushiki Kaisha, Japan

[21] Appl. No.: 230,376

[22] Filed: Aug. 10, 1988

[30] Foreign Application Priority Data

Feb. 8, 1988 [JP] Japan .................................. 63-25683

[51] Int. Cl.⁴ ............................................ B23K 20/10
[52] U.S. Cl. ..................................... 228/1.1; 228/110; 228/4.5
[58] Field of Search ............ 228/110, 111, 179, 180.2, 228/1.1, 4.5; 219/56.21, 56.22, 85 F

[56] References Cited

U.S. PATENT DOCUMENTS

| 3,128,649 | 4/1964 | Avila et al. | 228/1.1 |
| 3,400,448 | 9/1968 | Helda et al. | 228/4.5 |
| 3,643,321 | 2/1972 | Field et al. | 228/4.5 |
| 3,917,148 | 11/1975 | Runyon | 228/4.5 |
| 4,327,860 | 5/1982 | Kirshenboin et al. | 228/179 |

FOREIGN PATENT DOCUMENTS

| 58-180035 | 10/1083 | Japan . | |
| 58-82526 | 5/1983 | Japan . | |
| 59-191338 | 10/1984 | Japan . | |
| 78128 | 4/1986 | Japan | 228/1.1 |
| 214531 | 9/1986 | Japan | 228/4.5 |
| 1016116 | 5/1983 | U.S.S.R. | 228/1.1 |

OTHER PUBLICATIONS

IBM Technical Disclosure Bulletin, "Ultrasonic Bonding Tip", p. 1892, vol. 10, No. 12, May 1968.
Western Electric, "Multidirectional Ultrasonic Wire Bonding Tip", p. 7, Tech. Digest No. 20, Oct. 1970.

Primary Examiner—Nicholas P. Godici
Assistant Examiner—Samuel M. Heinrich
Attorney, Agent, or Firm—Leydig, Voit & Mayer

[57] ABSTRACT

A wire bonding capillary tip is disclosed. A metal ball at the end of a bonding wire is positioned adjacent a material to be bonded, and pressed against the material to plastically deform the ball. The orientation of the load applied to the ball changes continuously and smoothly. Ultrasonic vibrations are applied to the metal ball to diffuse elements of the metal ball and the material mutually. The capillary tip includes a flat loading surface to press the metal ball, a through-hole opened to the loading surface for passing the wire therethrough, and a convex surface around the opening of the through-hole which connects the through-hole to the flat loading surface continuously and smoothly.

4 Claims, 6 Drawing Sheets

CAPILLARY TIP FOR BONDING A WIRE

BACKGROUND OF THE INVENTION

1. Field of the Invention

The present invention relates to a method for bonding a wire and a capillary tip, and, more particularly, to a method for bonding a metal ball formed on the end of a wire to a material such as an aluminum electrode of a semiconductor chip, and to an apparatus for practicing that method.

2. Description of the Related Art

The method for bonding a wire described above is generally performed by the processes shown in FIGS. 8A to 8E.

After a copper ball 4 is formed by a discharge from a torch electrode 3 on the end of a copper wire 2 extending through a capillary tip 1 (FIG. 8A), the capillary tip 1 is lowered to press the copper ball 4 against an aluminum electrode 8 of a semiconductor chip 7. Chip 7 is attached to a die pad 6 of a copper lead frame 5, and is deformed plastically (FIG. 8B). During this time, the semiconductor chip 7 is heated to a temperature of 300° C. to 400° C. by a heat block 9 on which the die pad 6 is placed Ultrasonic vibrations are applied to the capillary tip 1 by a vibrating device (not shown) to interdiffuse the metallic elements of the copper ball 4 and the aluminum electrode 8, and thereby to bond the copper ball 4 on the copper wire 2 to the aluminum electrode 8.

Next, the capillary tip 1 is raised, which causes the copper wire 2 to feed through the capillary tip 1 (FIG. 8C), and the tip is then moved over and down to the wire connecting surface 11 of the inner lead 110. Wire 2 is pressed against and bonded to the inner lead 10 (FIG. 8D). This is called the stitch bond and looping method. During this time, the inner lead 10 is heated to a temperature of 300° C. to 400° C. by the heat block 9 supporting the inner lead 10. Ultrasonic vibrations are applied to the capillary tip 1 by the vibrating device (not shown) to mutually diffuse metallic elements of the copper wire 2 and the wire connecting surface 11 of the inner lead 10 to produce a bond between the copper wire 2 and the wire connecting surface 11.

Thereafter, the clamper 12 is closed to clamp the wire 2. Next, the capillary tip 1 and clamper 12 are raised, whereby the copper wire 2 is pulled by the clamper 12 to sever the copper wire 2 (FIG. 8E).

The capillary tip 1 employed in the known method of wire bonding performed in the above-described manner has a conical inside chamber 13 which is formed at an angle of 45°, as shown in FIGS. 9A and 9B.

FIG. 10 shows the bonding area structure of the copper wire 2 and the aluminum electrode 8 when the copper ball 4 is plastically deformed by the known capillary tip 1. More specifically, the copper ball 4 is plastically deformed due to the loads applied by the conical inside chamfer 13 and a flat loading surface 14 of the capillary tip 1 (FIGS. 9A and 9B). Accordingly, the deformed copper ball 4 has a conical loaded surface 15 and a flat loaded surface 16 (FIG. 10). The lower portion of the copper ball 4 forms a copper and aluminum (Cu-Al) alloy layer 17. An electrode substrate 18 composed of Si or an insulating film is disposed under the aluminum electrode 8.

In FIG. 9A, vectors 19 represent the loads to which the copper ball 4 is subjected as it is pressed. These loads are applied by the inside chamfer 13 and the loading surface 14 of the capillary tip 1. That is, vectors representing the loads applied from the inside chamfer 13 are oriented toward the center of the bonding area, and those representing the loads applied from the loading surface 14 are perpendicular to the aluminum electrode 8. Accordingly, the slip orientation of the copper forming the copper ball 4 is fixed. As shown in FIG. 11, a nucleus 20 having a reduced number of slip-lines is generated in the center of the bonding area on the under surface of the copper ball 4 where the intermetallic alloy of the copper ball 4 and the aluminum electrode 8 is not produced.

The alloy layer 17 cannot be uniformly formed by means of the heat energy applied to the aluminum electrode 8 and the ultrasonic vibration energy applied to the copper ball 4, which reduces the reliability of bonding.

Moreover, recently the circuits of semiconductor chips have become more dense, the electrode size for bonding has shrunk, and smaller metal balls have been required. However, since the orientation of the vectors 19, representing the loads, changes suddenly at a boundary portion 21 between the inside chamfer 13 and the loading surface 14 in the known capillary tip 1 (FIG. 9A), if the size of the copper ball 4 is made smaller, the boundary portion 21 may break through the copper ball 4 and strike the aluminum electrode 8.

SUMMARY OF THE INVENTION

A major object of the present invention is to solve the above-described problems of the prior art, and to provide a wire bonding method and a capillary tip which are able to form a uniform alloy layer all over the bonding area, and hence provide a more reliable bonding structure.

To this end, the present invention provides a wire bonding method which comprises the steps of: positioning a metal ball formed at the end of the wire over a metarial to be bonded; pressing the metal ball against the material to deform the metal ball plastically with a load having an orientation changes continuously and smoothly; and diffusing elements of the metal ball and the material by applying ultrasonic vibrations to the deformed metal ball.

The present invention also provides a capillary tip for practicing this method which comprises: a flat loading surface for pressing the metal ball; a through-hole opened to the loading surface through which wire passes; a convex surface which connects the through-hole and the flat loading surface continuously and smoothly.

According to the present invention, the orientation of the load applied to the metal ball changes continuously and smoothly. Therefore, slip lines of the metal ball appear all over the bonding area, whereby a uniform alloy layer is formed between the metal ball and the material to be bonded.

DESCRIPTION OF THE PREFERRED EMBODIMENTS

The present invention will be described below by way of example with reference to the accompanying drawings.

Figure 1A:
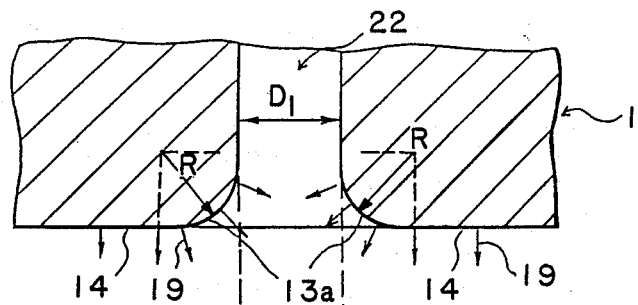
FIGS. 1A and 1B are cross-sectional and plan views of parts of a capillary tip according to one embodiment of the present invention.
Figure 1B:
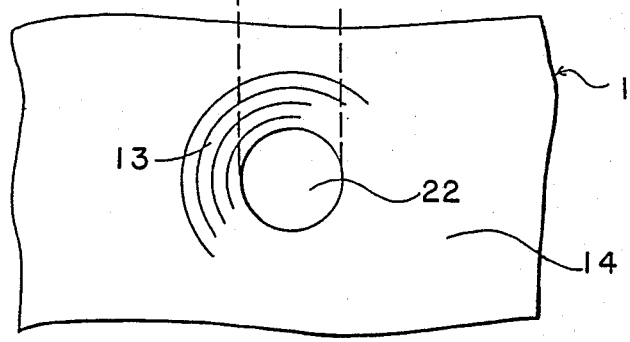

Referring to FIGS. 1A and 1B, a capillary tip 1 has a loading surface 14 that is flat other than proximate a through-hole 22, $D_1$ in diameter, through which a copper wire may be passed. The through-hole 22 is opened to the loading surface 14, and has a convex surface 13a around this opening area. The convex surface connects the through-hole 22 and the flat loading surface 14 with a continuously and smoothly varying curvature having a radius R which is smaller than the wire diameter $D_2$.

Wire bonding is performed using similar processes to those shown in FIGS. 8A to 8E using the capillary tip 1 above-described.

First, the copper wire 2 is passed through the through-hole 22 of the capillary tip 1, and a copper ball 4 is formed by heating the extending end of the wire 2 with the torch electrode 3. The diameter of the ball 4 is from 1.5 to 2.5 times larger than the wire diameter $D_2$. Next, the capillary tip 1 is lowered and positioned on an aluminum electrode 8 (a material to be bonded) to a semiconductor chip 7 attached to a die pad 6 of a copper lead frame 5. The capillary tip 1 is further lowered to cause the copper ball 4 to be deformed plastically.

Since the convex surface 13a of the capillary tip 1 changes continuously and smoothly and a curvature radius R, the orientation of the loads 19 applied to the copper ball 4 at this time changes continuously and smoothly. In addition to the load on the copper ball 4, the semiconductor chip 7 is heated to a temperature of 300° C. to 400° C. by a heat block 9 supporting the die pad 6, and ultrasonic vibrations are applied to the capillary tip 1 by a vibrating device (not shown). In consequence, the metallic elements of the copper ball 4 and the aluminum electrode 8 interdiffuse, to produce a bond between the copper ball 4 of the copper wire 2 and the aluminum electrode 8.

Next, after the capillary tip 1 is raised, which causes the copper wire 2 to feed through the capillary tip 1, the tip 1 is moved over and down to the wire connecting surface 11 of the inner lead 10 and the wire 2 is then pressed against and bonded to the inner lead 10. This is called the stitch bond and looping method. During this time, the inner lead 10 is heated to a temperature of 300° to 400° C. by the heat block 9 supporting the inner lead 10, and ultrasonic vibrations are applied to the capillary tip 1 by the vibrating device (not shown). In consequence, the metallic elements of the copper ball 4 of the copper wire 2 and the wire connecting surface 11 of the inner lead 10 interdiffused, to produce a bond therebetween.

Thereafter, the clamper 12 is closed to clamp the wire 2. Next, the capillary tip 1 and the clamper 12 are raised, whereby the copper wire 2 is pulled by the clamper 12 to sever the copper wire 2.

Figure 2:
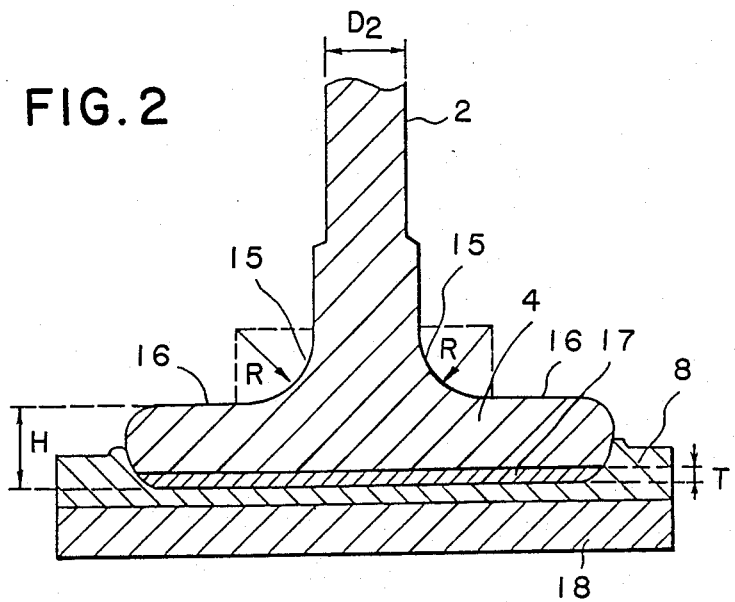
FIG. 2 is a cross-sectional view of a bonding area formed by the capillary tip embodiment of FIG. 1.

FIG. 2 shows a cross-sectional view of a bonding area. The alloy 17 is formed by the loads applied to the copper wire 2 and the aluminum electrode 8 by the convex inside surface 13a and the flat loading surface 14 of the capillary tip. The copper ball 4 is plastically deformed and has the concave surface 15 and the flat surface 16 formed on it. There exists an electrode substrate 18 composed of Si or an insulating film under the aluminum electrode 8.

Figure 3:
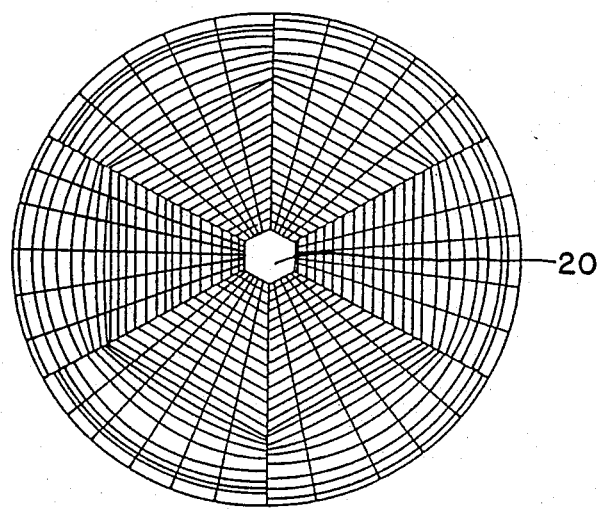
FIG. 3 illustrates metallic slip-lines appearing on the under surface of the bonded copper ball of FIG. 2.
Figure 9A:
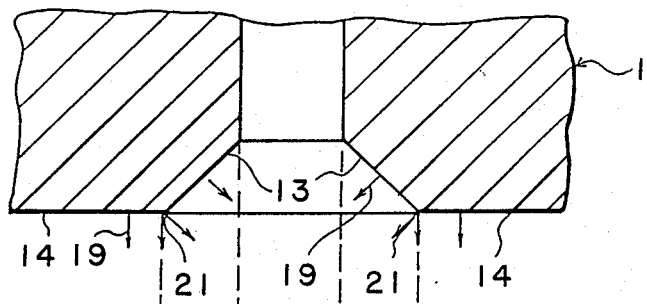
FIGS. 9A and 9B are cross-sectional and plan views of parts of a known capillary tip.
Figure 9B:
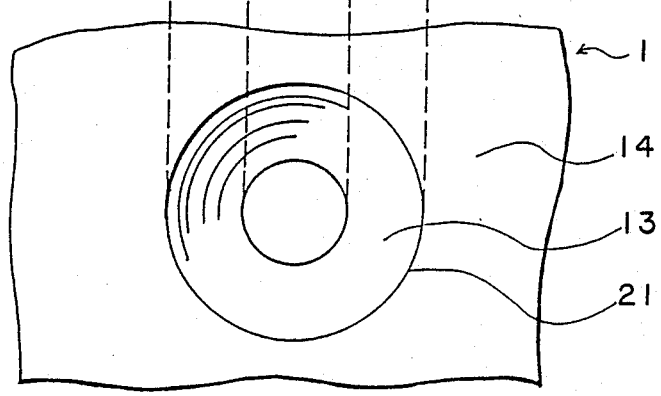
Figure 11:
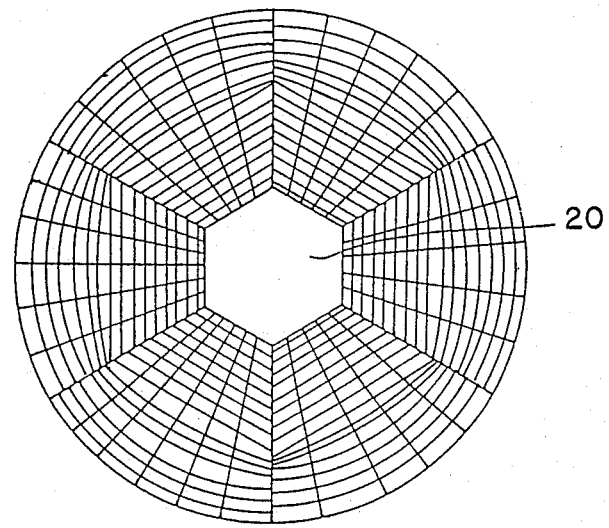
FIG. 11 illustrates metallic slip-lines appearing on the under surface of the bonded copper ball of FIG. 10.

As described above, the convex surface 13a of the capillary tip 1 is convex, so that the load vectors 19 applied to the copper ball 4 gradually and continuously change in direction (FIG. 1). These varied orientation vectors 19 will act not only on the surface between the copper ball and the aluminum electrode but also on the inside of the copper ball 4. As shown in FIG. 3, slip lines appear on the upper surface of the deformed copper ball 4, where the intermetallic alloy of the copper ball 4 and the aluminum electrode 8 is not produced, over a wider area that with the capillary tip of FIGS. 9A and 9B. The nucleus 20 having few slip-lines is reduced in area. As a result, the copper and aluminum alloy layer 17 is uniformly formed over the entire bonding area of the copper ball 4 and the aluminum electrode 8.

Figure 4:
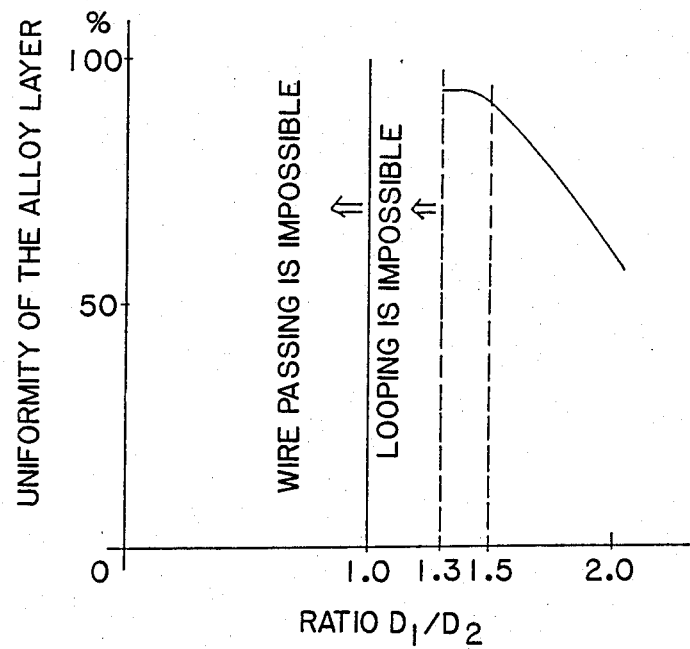
FIG. 4 is a graph showing the uniformity of the copper and aluminum alloy layer relative to the ratio of $D_1$, the through-hole diameter of the capillary tip to $D_2$, the copper wire diameter.

The result shown in FIG. 4 can be obtained by researching the uniformity of the copper and aluminum alloy layer 17, changing the parameter of the ratio D1/D2; where D1 is the diameter of through-holes 22 of a capillary tip 1 and D2 is the diameter of the wire. It was found that when the ratio D1/D2 is less than 1.3, the copper wire could not easily move in the through-hole 22 and when it is more than 1.5, the uniformity of the alloy layer 17 is reduced. So the optimum ratio D1/D2 was found to be between 1.3 and 1.5.

Figure 5:
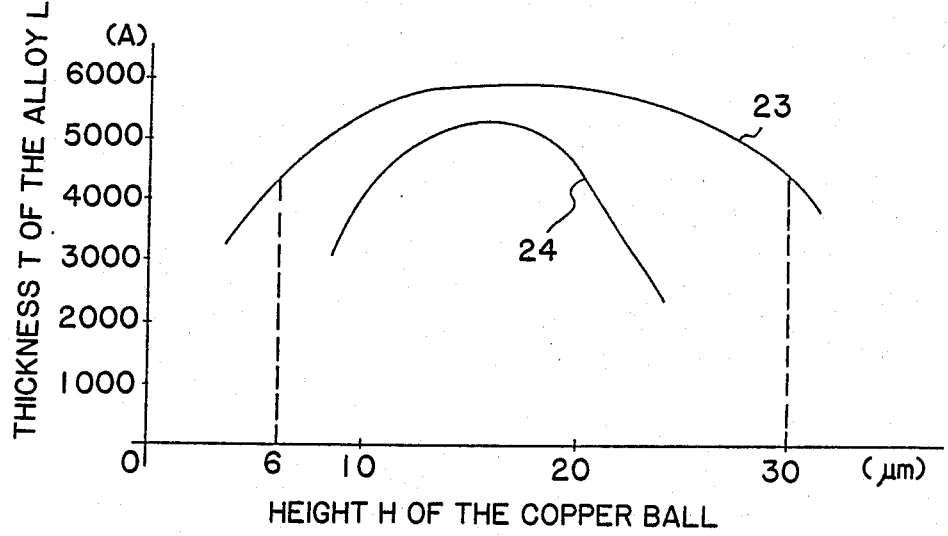
FIG. 5 is a graph showing the relationship between the height H of the deformed copper ball and the thickness T of the copper and aluminum alloy layer.

The relationship between the height H of the deformed copper ball 4 and the thickness T of the copper and aluminum alloy layer 17 is as shown by a curve 23 in FIG. 5. The bonding parameters are as follows: the load is 130 gram and ultrasonic vibrations of 60 kHz are applied for 30 milliseconds. Judging from this graph, the smooth continuation face, from the convex inside surface 13 to the flat load surface 14 of a capillary tip 1, prevents the load from being concentrated, so that the copper ball 4 will not be broken when the ball size is small. It is possible to produce a normal wire bond until the copper ball 4 deformed being H is about 6 μm. This will make the ultrasonic vibration energy most effective in bonding. To compare this with the known method, the relationship between the copper ball 4 deformed height H by the known method and the thickness T of the copper and aluminum alloy layer 17 is shown as a curve 24 in FIG. 5.

Figure 6:
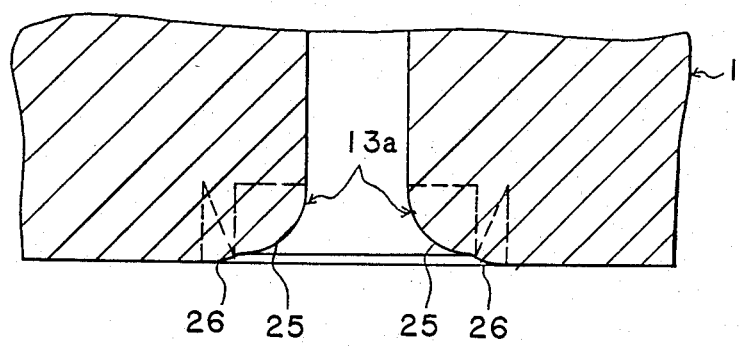
FIGS. 6, 7A and 7B show other embodiments of capillary tip structures according to the present invention.
Figure 7A:
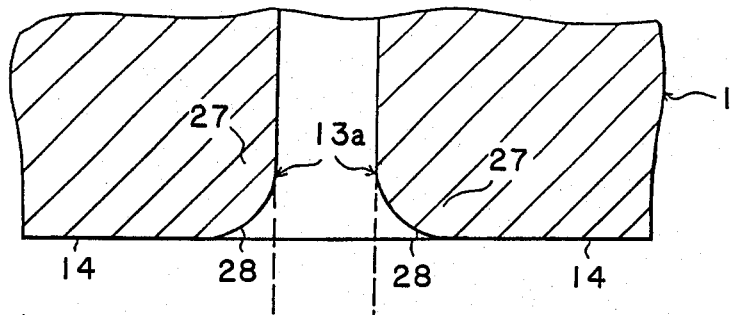
Figure 7B:
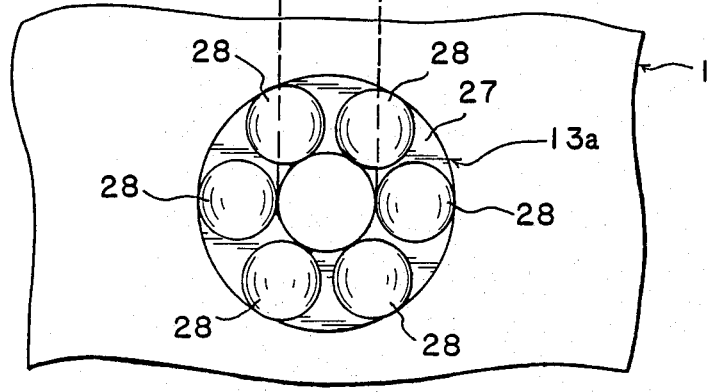
Figure 10:
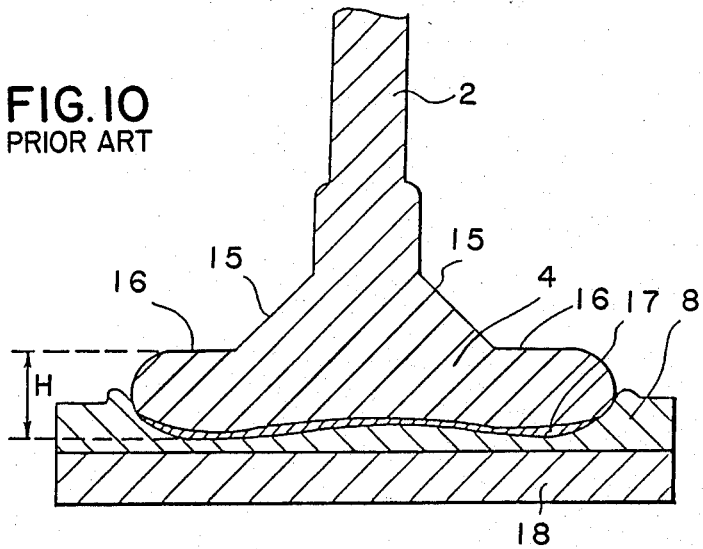
FIG. 10 is a cross-sectional view of a bonding area formed by a known capillary tip.
Figure 8A:
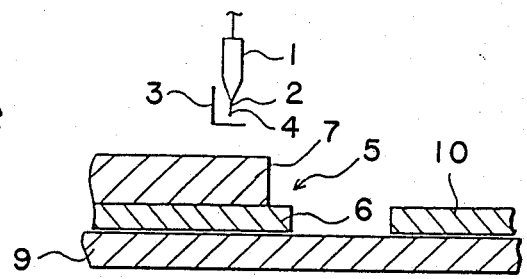
FIGS. 8A to 8E show the steps of a typical wire bonding method.
Figure 8B:
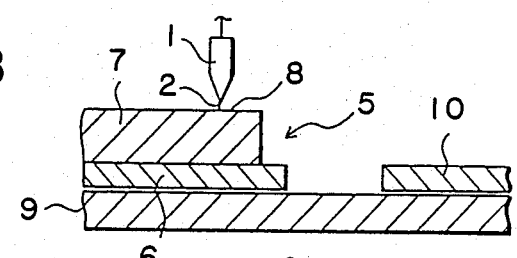
Figure 8C:
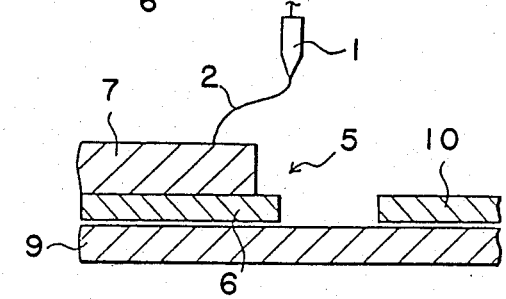
Figure 8D:
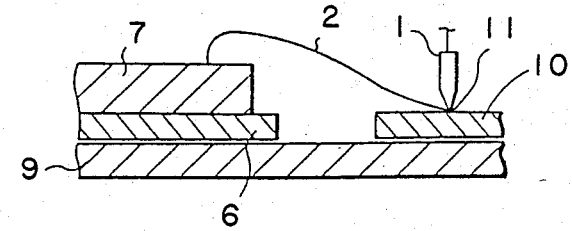
Figure 8E:
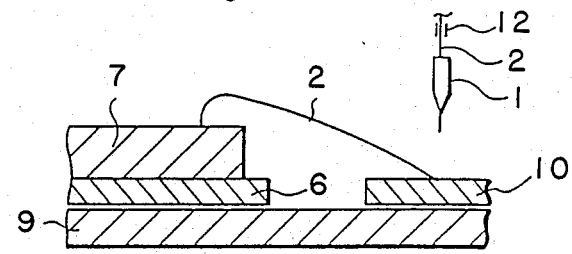

In the above embodiment, the inside chamfer 13a of the capillary tip 1 forms one continuous and smooth convex surface. However, it is possible to have a multiple curvature center of convex surfaces 25 and 26 as shown in FIG. 6. Alternatively, it is possible to form the multiple convex surfaces 28 on the conical surface 27, as shown in FIGS. 7A and 7B.

The above embodiment relates to the bonding of a copper ball 4, formed at the end of the copper wire 2 to the aluminum electrode 8. However, the present invention is not limited to this combination and it may be applied to metals other than copper for bonding. Further, metals other than aluminum may be employed as a material to be bonded.

What is claimed is:

1. A capillary tip for bonding a wire by pressing a metal ball formed at the end of the wire against the material to be bonded to deform the ball plastically and to bond the ball and the material to be bonded by inter-diffusion of the ball and the material to be bonded while applying heat to the material to be bonded and ultrasonic vibrations to the deformed ball comprising:

a flat loading surface for pressing a metal ball;
   a through-hole of circular cross-section open to said loading surface for passing a wire of circular cross-section therethrough, the wire having the ball at one end;
   a convex surface connecting said flat loading surface and said through-hole continuously and smoothly wherein the convex surface includes a generally conical surface on which are circumferentially superposed a plurality of convex surfaces of generally uniform partially spherical cross-section, the cross-sectional radii of said convex surfaces being smaller than the diameter of the wire.

2. The capillary tip of claim 1 wherein the diameter of said through-hole is 1.3 to 1.5 times larger than the diameter of the wire.

3. A capillary tip for bonding a wire by pressing a metal ball formed at the end of the wire against the material to be bonded to deform the ball plastically and to bond the ball and the material to be bonded by inter-diffusion of the ball and the material to be bonded while applying heat to the material to be bonded and ultrasonic vibrations to the deformed ball comprising:

a flat loading surface for pressing a metal ball;
   a through-hole of circular cross-section open to said loading surface for passing a wire of circular cross-section therethrough, the wire having the ball at one end;
   a convex surface having two sections, each a portion of a circle of a different radius, connecting said flat loading surface and said through-hole continuously and smoothly wherein the largest cross-sectional radius of said convex surface is smaller than the diameter of the wire.

4. The capillary tip of claim 3 wherein the diameter of said through-hole is 1.3 to 1.5 times larger than the diameter of the wire.

* * * * *